United States Patent
Feldtkeller et al.

(10) Patent No.: US 6,822,399 B2
(45) Date of Patent: Nov. 23, 2004

(54) HALF-BRIDGE CIRCUIT (75) Inventors: Martin Feldtkeller, München (DE); Andreas Kiep, München (DE)

(73) Assignee: Infineon Technologies AG, Munich (DE)

(*) Notice: Subject to any disclaimer, the term of this patent is extended or adjusted under 35 U.S.C. 154(b) by 196 days.

(21) Appl. No.: 10/056,767

(22) Filed: Jan. 24, 2002

(65) Prior Publication Data

US 2002/0096779 A1 Jul. 25, 2002

(30) Foreign Application Priority Data

Jan. 24, 2001 (DE) .......................................... 101 03 144

(51) Int. Cl.⁷ .............................................. H05B 37/00
(52) U.S. Cl. .................... 315/209 R; 315/291; 315/244; 257/E27.06; 257/388; 363/144
(58) Field of Search .............................. 315/209 R, 291, 315/307, 244; 257/338, E21.544, E27.059, E27.06; 363/144, 17, 37, 56.01, 56.03, 131, 132, 134; 323/224, 271, 287

(56) References Cited

U.S. PATENT DOCUMENTS

| | | | |
|---|---|---|---|
| 5,130,918 A | 7/1992 | Schuster | 363/141 |
| 5,444,291 A | 8/1995 | Paparo et al. | 257/552 |
| 5,449,936 A | 9/1995 | Paparo et al. | 257/337 |
| 5,481,178 A * | 1/1996 | Wilcox et al. | 323/287 |
| 6,269,014 B1 * | 7/2001 | Sander et al. | 363/132 |
| 6,314,007 B2 * | 11/2001 | Johnson et al. | 363/37 |

FOREIGN PATENT DOCUMENTS

| | | |
|---|---|---|
| DE | 40 05 333 A1 | 8/1991 |
| DE | 691 26 618 T2 | 6/1993 |
| DE | 691 28 936 T2 | 6/1993 |
| DE | 199 35 100 A1 | 3/2001 |
| JP | 04-075368 A | 3/1992 |

* cited by examiner

*Primary Examiner*—Haissa Philogene
(74) *Attorney, Agent, or Firm*—Laurence A. Greenberg; Werner H. Stemer; Ralph E. Locher (57) ABSTRACT

A half-bridge circuit includes: a vertically designed n-conducting first MOS transistor that is integrated in a first semiconductor body having a front side and a rear side; and a vertically designed p-conducting second MOS transistor that is integrated in a second semiconductor body having a front side and a rear side. The first and second transistors are connected in series between a first connection terminal and a second connection terminal. The half-bridge circuit also includes a drive circuit for driving the first and second transistors. The first and second transistors are applied to a common connection plate.

11 Claims, 9 Drawing Sheets

HALF-BRIDGE CIRCUIT

BACKGROUND OF THE INVENTION

Field of the Invention

The present invention relates to a half-bridge circuit having a first and a second transistor that are connected in series, and having a drive circuit for driving the transistors. The invention relates, in particular, to a half-bridge circuit for use in a switching regulator.

Figure 1:
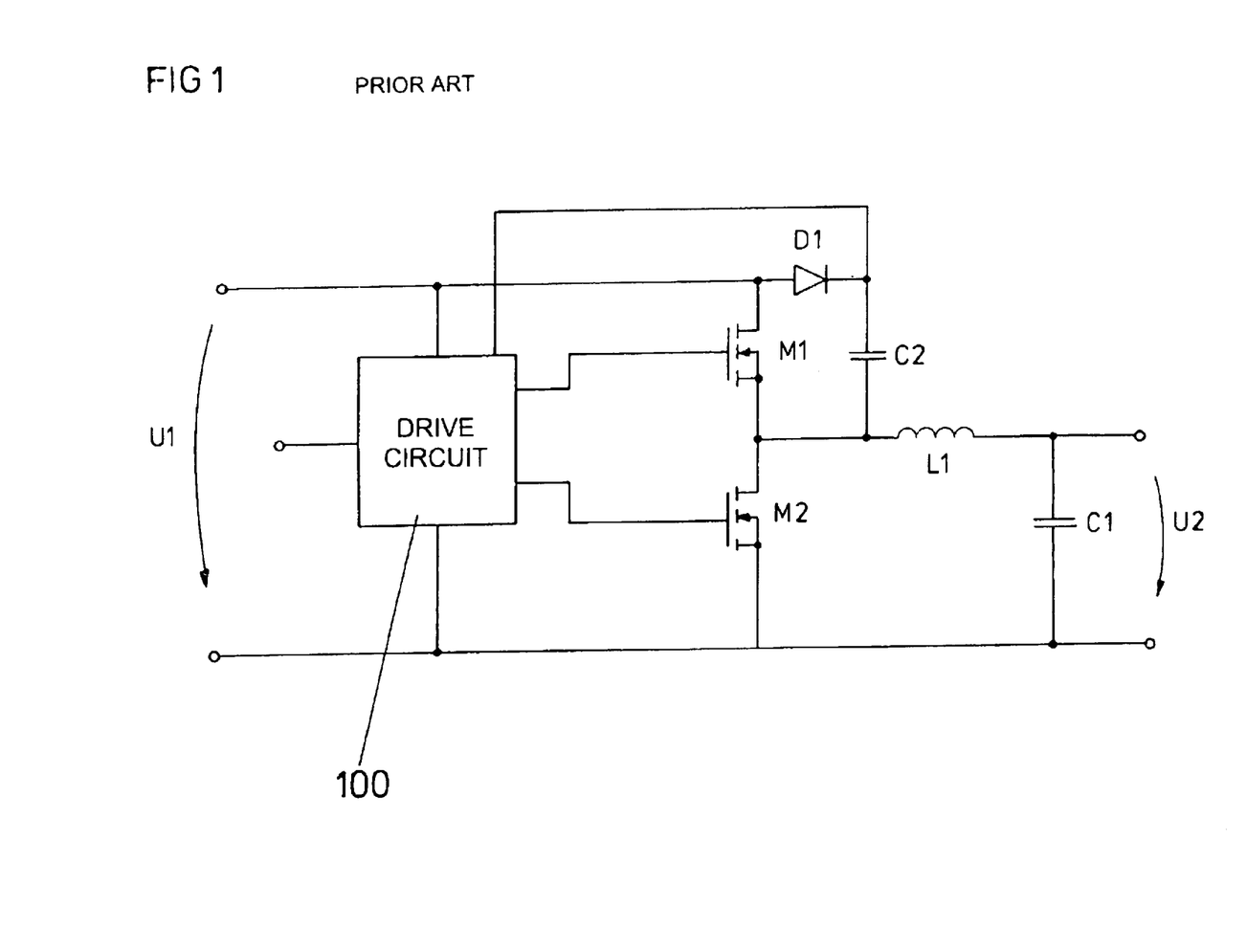
FIG. 1 shows a prior art half-bridge circuit.

The handbook "1999/2000 Industrial Power Seminar", pages 6–3 and 6–7, from Intersil Corporation™, Irvine, Calif. USA 92618, describes a switching regulator with a half-bridge circuit as shown in FIG. 1. The half-bridge circuit shown in FIG. 1 has two n-channel MOSFETs M1, M2, whose drain-source paths are connected to form a series circuit. This series circuit is connected to a supply voltage U1. A drive circuit 100 is provided for driving the MOSFETs M1, M2. The drive circuit 100 is connected to the gate connections of the MOSFETs M1, M2 and to the supply voltage for voltage supply purposes. So that the required drive potential for the first MOSFET M1, which functions as a high-side switch, can be made available in the drive circuit 100, a bootstrap circuit with a capacitor C2 and a diode D1 is provided, which is likewise connected to the drive circuit 100. The drive potential required for the first MOSFET M1 is higher than the supply voltage U1.

The known half-bridge circuit shown in FIG. 1 is part of a switching regulator, a so-called buck converter in the example illustrated, which provides a smaller output voltage U2 from the supply voltage U1. In this case, a series circuit including a coil L1 and a capacitor C1 is connected in parallel with the second MOSFET M2, which functions as a low-side switch. It is possible to tap off the output voltage U2 across the capacitor C1.

Switching regulators of this type are used, in particular, in computers for supplying voltage to the CPU. In this case, the input voltage is usually 5.0 V and the output voltage is between 1.3 V and 2.0 V. A customary clock frequency with which the two MOSFETs are switched is about 200 kHz. In this case, the two MOSFETs M1, M2 are driven, depending on the output voltage U2, such that the output voltage is at least approximately constant—independently of the load and of fluctuations in the input voltage.

For future applications in computers, the switching regulators ought to be able to correct a load change at the output of the switching regulator within a time period of less than 100 ns. That requires clock frequencies of 2 MHz or more for the switches.

In this case, the line connections between the components and the half-bridge should be as short as possible. Furthermore, the two transistors should be accommodated in one housing, as much as possible, to save space.

In the case of the known half-bridge circuit, a comparatively high outlay is required to accommodate the two transistors and possibly also the drive circuit. Vertically designed transistors are usually used as the power transistors in switching regulators. Such transistors are usually applied to a printed circuit board by their rear side, which forms the drain connection of the transistor. In the case of the known circuit arrangement shown in FIG. 1, different potentials are required at the drain connections of the transistors, so that a printed circuit board on which the two transistors are to be jointly applied must have at least two islands with different potentials. Moreover, if the intention is to accommodate the drive circuit on the same printed circuit board, at least three such potential islands must be provided.

SUMMARY OF THE INVENTION

It is accordingly an object of the invention to provide a half-bridge circuit which overcomes the above-mentioned disadvantages of the prior art apparatus of this general type.

In particular, it is an object of the invention to provide a half-bridge circuit for switching regulators, which can be realized in a space-saving manner and which can be used at comparatively high switching frequencies.

With the foregoing and other objects in view there is provided, in accordance with the invention, a half-bridge circuit including a first semiconductor body having a first MOS transistor that is integrated in the first semiconductor body. The first MOS transistor is a vertically designed n-conducting MOS transistor. The half-bridge circuit includes a second semiconductor body having a second MOS transistor that is integrated in the second semiconductor body. The second MOS transistor is a vertically designed p-conducting MOS transistor. The half-bridge circuit also includes: a drive circuit for driving the first MOS transistor and the second MOS transistor; a common connection plate to which the first MOS transistor and the second MOS transistor are applied; and a first connection terminal and a second connection terminal. The first MOS transistor and the second MOS transistor are connected in series between the first connection terminal and the second connection terminal.

In accordance with an added feature of the invention, the first semiconductor body has a front side and a rear side; the first MOS transistor has a drive connection and a first load path connection that are accessible at the front side of the first semiconductor body; the first MOS transistor has a second load path connection that is accessible at the rear side of the first semiconductor body; the second semiconductor body has a front side and a rear side; the second MOS transistor has a drive connection and a first load path connection that are accessible at the front side of the second semiconductor body; and the second MOS transistor has a second load path connection that is accessible at the rear side of the second semiconductor body.

In accordance with an additional feature of the invention, a capacitor is connected between the first load path connection of the first transistor and the first load path connection of the second transistor.

In accordance with another feature of the invention, the capacitor is applied to the first semiconductor body and to second semiconductor body; the capacitor has a first connection connected to the first semiconductor body; and the capacitor has a second connection connected to the second semiconductor body.

In accordance with a further feature of the invention, a bonding wire electrically connects the first connection of the capacitor to the first semiconductor body; and a bonding wire electrically connects the second connection of the capacitor to the second semiconductor body.

In accordance with yet an added feature of the invention, a first layer electrically connects the first connection of the capacitor to the first semiconductor body; and a second layer electrically connects the second connection of the capacitor to the second semiconductor body. The first layer and the second layer are made of either a soldering material or an electrically conductive adhesive.

In accordance with yet an additional feature of the invention, an electrically conductive adhesive solders or bonds the first semiconductor body and the second semiconductor body onto the common connection plate.

In accordance with yet another feature of the invention, the drive circuit is integrated into a third semiconductor body; the first semiconductor body has a front side; and the third semiconductor body is applied to the front side of the first semiconductor body.

In accordance with yet a further feature of the invention, a common housing surrounds the first semiconductor body, the second semiconductor body, and the drive circuit.

The invention makes use of the fact that in a half-bridge circuit with a p-conducting transistor and an n-conducting transistor, of which only one at a time is to be driven conductively, the drain connections of the two transistors are connected to one another and are thus at a common potential. The rear sides of the two semiconductor bodies in which the two transistors are integrated can thus be applied to a common electrically conductive connection plate. The respective drain connection is accessible at each of the rear sides. This connection plate is, in particular, a lead frame of a housing for integrated circuits. The source connections and the gate connections of the transistors are available for further interconnection at the respective front sides of the semiconductor bodies.

In the half-bridge circuit, the first p-conducting transistor and the second n-conducting transistor are connected in series between a first terminal for a first supply potential and a second terminal for a second supply potential. The integrated drain connections of the two transistors form the output of the half-bridge circuit in this case. In the case of the customary interconnection of the half-bridge circuit, a positive supply potential is present at the first connection terminal and a negative supply potential, or ground, is present at the second connection terminal. The p-channel transistor then functions as a high-side switch and the n-channel transistor functions as a low-side switch. Using a p-channel transistor as a high-side switch in the circuit arrangement provides the advantage that there is no need for a bootstrap circuit for providing an increased drive potential for the high-side switch.

The on resistance of a p-channel transistor is greater than that of an n-channel transistor having the same channel cross-sectional area. In the present invention, using a p-channel transistor does not constitute a disadvantage with regard to future expected applications. In future switching regulators, it is expected that the ratio of the input voltage to the output voltage will increase further. In present switching regulators with an input voltage of 5 V and an output voltage of about 1.2 V, this ratio is about 4.17. In switching regulators for future applications, in particular, in switching regulators for supplying voltage to a CPU in a computer, a ratio of the input voltage to the output voltage of 10 or more can be expected. In so-called buck converters, which provide a smaller output voltage from an input voltage, the relationship between the time duration during which a current flows via the high-side switch and the duration of a clock period is like the relationship between the output voltage and the input voltage. Given a ratio of input voltage to output voltage of 10, current flows through the p-channel transistor as the high-side switch only about 10% of the time, while a current flows via the low-side switch over 90% of the time. To better dissipate the heat loss to the outside, it is desirable for the power loss to be distributed uniformly between the two transistors. Since the low-side switch conducts nine times as long as the high-side switch, the resistance of the low-side switch is permitted to be only ⅑ of the resistance of the high-side switch if the same power loss is obtained on both transistors. In other words: the resistance of the high-side switch is permitted to be nine times as large as the resistance of the low-side switch. The costs and the space requirement of a p-channel transistor which is used as high-side switch and whose on resistance is nine times as large as the on resistance of the associated n-channel transistor used as low-side switch are likely to be lower than those of the low-side switch.

Moreover, by dispensing with the bootstrap circuit, the half-bridge circuit can be realized in a space-saving and cost-effective manner. This holds true all the more as the capacitor of the bootstrap circuit is usually embodied as an external component, which particularly affects the costs in the case of conventional half-bridge circuits.

One embodiment of the invention provides for a capacitor to be connected between the source connection of the first transistor and the source connection of the second transistor, that is to say in parallel with the supply terminals. This capacitor serves for bridging switching spikes that can arise during the clocked driving of the two transistors. The capacitance of this capacitor can be comparatively small at high switching frequencies. Therefore, one embodiment of the invention provides for a first connection of this capacitor to be directly connected to the source connection at the front side of the first semiconductor body of the first transistor, and for the other connection of the capacitor to be connected directly to the source connection at the front side of the semiconductor body of the second transistor. The connection between the capacitor and the source connections is preferably effected by bonding wires or by directly soldering or bonding the capacitor connections onto the source connections. The capacitor is, in particular, a ceramic capacitor that has an elongate form and an exposed connection at each of the ends. An insulating ceramic layer covers the remainder of the capacitor.

A further embodiment of the invention provides for the drive circuit to be integrated in a third semiconductor body which is applied directly to the source connection at the front side of the semiconductor body of the n-conducting second transistor.

The two transistors, the drive circuit and, if appropriate, the capacitor of the half-bridge circuit can in this way be accommodated in a housing in a space-saving manner.

Other features which are considered as characteristic for the invention are set forth in the appended claims.

Although the invention is illustrated and described herein as embodied in a half-bridge circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3b is a sectional illustration of the half-bridge circuit shown in FIG. 3a;

FIG. 4b is sectional illustration of the half-bridge circuit with the drive circuit shown in FIG. 4a;

FIG. 4c is sectional illustration of another embodiment of the half-bridge circuit with the drive circuit shown in FIG. 4a;

FIG. 6b shows a sectional illustration of the half-bridge circuit shown in FIG. 6a.

DESCRIPTION OF THE PREFERRED EMBODIMENTS

Figure 2:
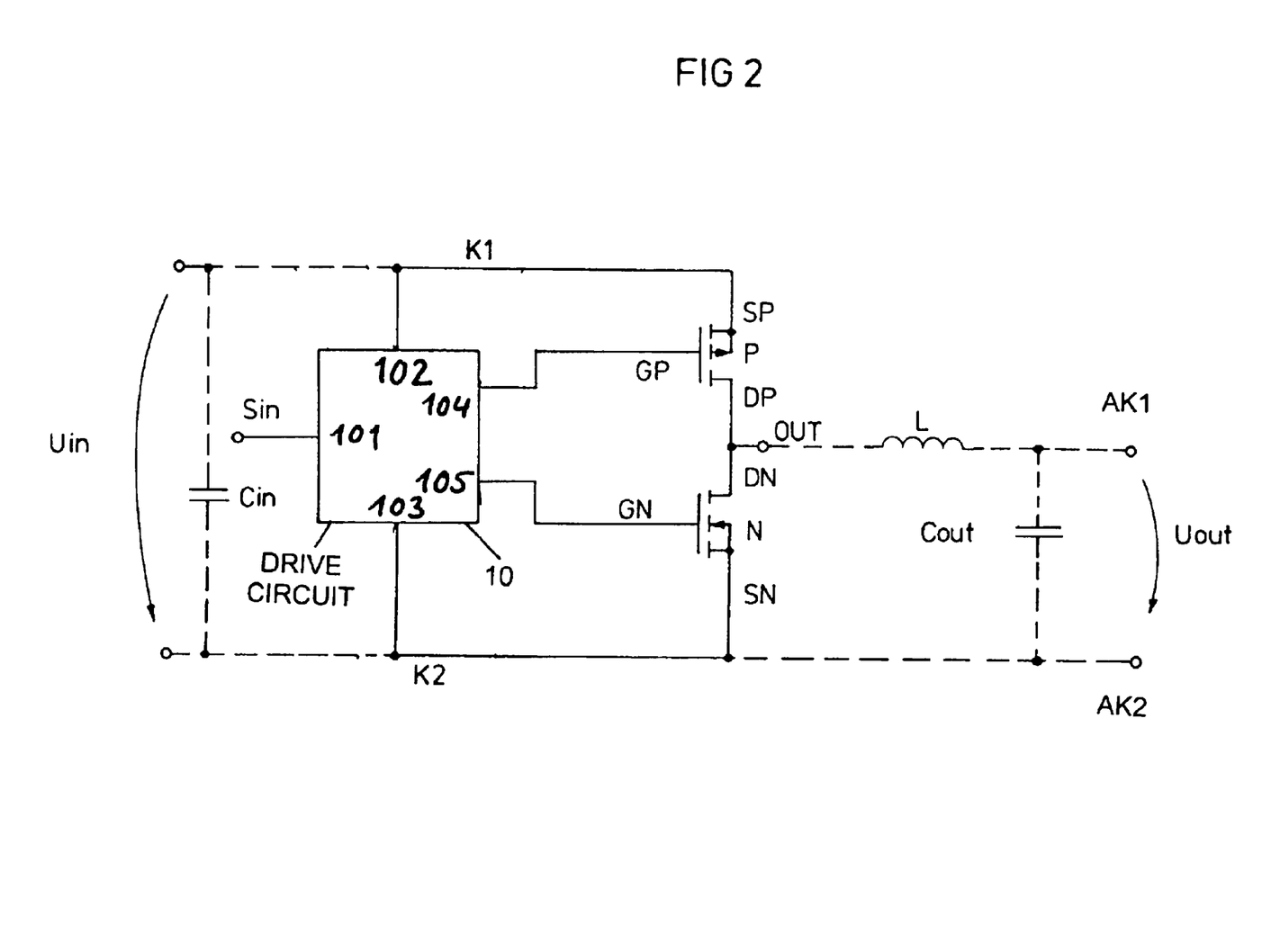
FIG. 2 shows an electrical equivalent circuit diagram of an inventive half-bridge circuit.

Referring now to the figures of the drawing in detail and first, particularly, to FIG. 2 thereof, there is shown the electrical circuit diagram of an inventive half-bridge circuit. The circuit arrangement has a p-channel transistor P and an n-channel transistor N, which are each designed as vertical power MOSFETs. The transistors P and N are connected in series between a first terminal K1 and a second terminal K2. An input voltage Uin can be applied between the first terminal K1 and the second terminal K2. The source connection SP of the p-channel transistor P is connected to the first terminal K1 and the source connection SN of the n-channel transistor N is connected to the second terminal K2. The interconnected drain connections DP, DN of the two transistors P, N form an output OUT of the half-bridge circuit.

A drive circuit 10 having supply connections 102, 103 is provided for driving the two transistors P, N. The supply connection 102 is connected to the first terminal K1 and the supply connection 103 is connected to the second terminal K2. The gate connection GP of the p-channel transistor P is connected to a first output 104 of the drive circuit 10. The gate connection GN of the n-channel transistor N is connected to a second output 105 of the drive circuit 10. The two transistors P, N are driven via the outputs 104, 105 of the drive circuit 10 according to a drive signal Sin that is present at an input 101 of the drive circuit 10. In this case, the two transistors P, N are driven such that only one of the two transistors P, N is in the on state so that the two connection terminals K1, K2 are never short-circuited.

In order to provide a better understanding of the mode of operation and the possible use of such a half-bridge circuit, a possible interconnection of the half-bridge circuit in a switching regulator is depicted by dashed lines shown in FIG. 2. During the operation of the switching regulator, an input voltage Uin is applied to the connection terminals K1, K2, which is converted into an output voltage Uout present at output terminals AK1, AK2. To that end, a series circuit including a coil L and a capacitor Cout is connected in parallel with the drain-source path DN-SN of the n-channel transistor N. It is possible to tap off the output voltage Uout across the capacitor Cout. The ratio of input voltage Uin to output voltage Uout is dependent on the time durations during which the p-channel transistor P and the n-channel transistor N are alternately switched on. If the p-channel transistor P is in the on state, then the series circuit including the coil L and the capacitor Cout is connected to the input voltage Uin. If the p-channel transistor P is in the off state and the n-channel transistor N is in the on state, then the n-channel transistor N closes the electric circuit between the inductor L and the capacitor Cout, the inductor L outputting the previously stored energy to the capacitor Cout.

In order to turn on the n-channel transistor N, a potential that is greater than the potential at the source connection SN is required at the gate connection GN. To that end, the gate connection GN is preferably connected to the first connection terminal K1. In order to turn off the n-channel transistor N, the gate connection GN is preferably connected to the second supply terminal K2 by the drive circuit 10. To turn on the p-channel transistor P, the gate connection GP is preferably connected to the second supply terminal K2 via the output 104 of the drive circuit 10. To turn off the p-channel transistor P, the gate connection GP thereof is preferably connected to the first supply terminal K1 via the output 104 of the drive circuit 10. No bootstrap circuit is required for driving the p-channel transistor P.

The two transistors P, N are designed as vertical power MOSFETs. Each of the two transistors are integrated in a respective semiconductor body CH1, CH2 with a front side and a rear side. The drain connections DP, DN of the two transistors P, N are available at the rear sides of the semiconductor bodies CH1, CH2. The drive circuit 10 is preferably integrated in a third semiconductor body with a front side and a rear side, and the rear side of this third semiconductor body forms the connection 103 of the drive circuit.

Figure 3A:
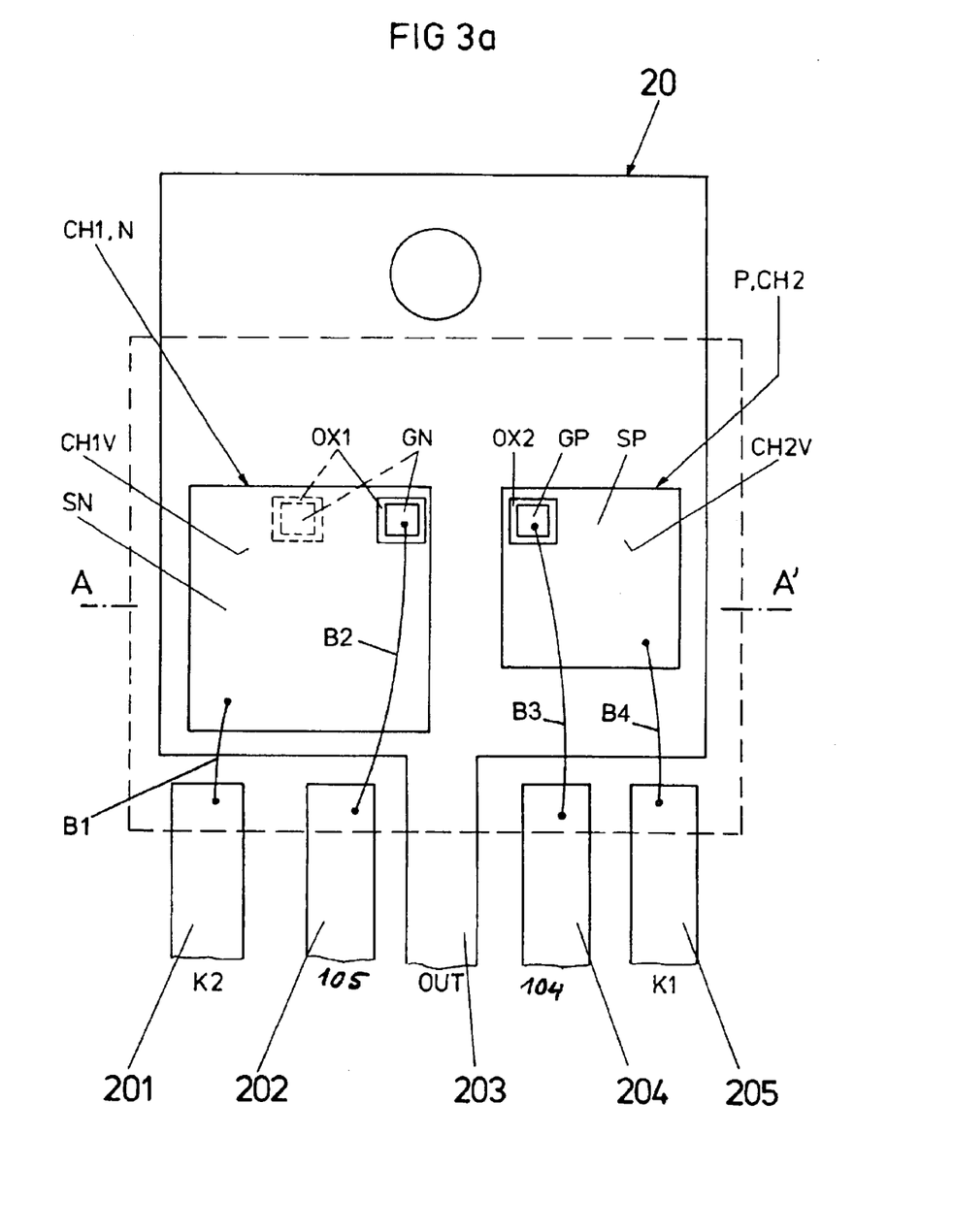
FIG. 3a shows a plan view of an inventive half-bridge circuit with a first transistor and a second transistor on a common connection plate.
Figure 3B:
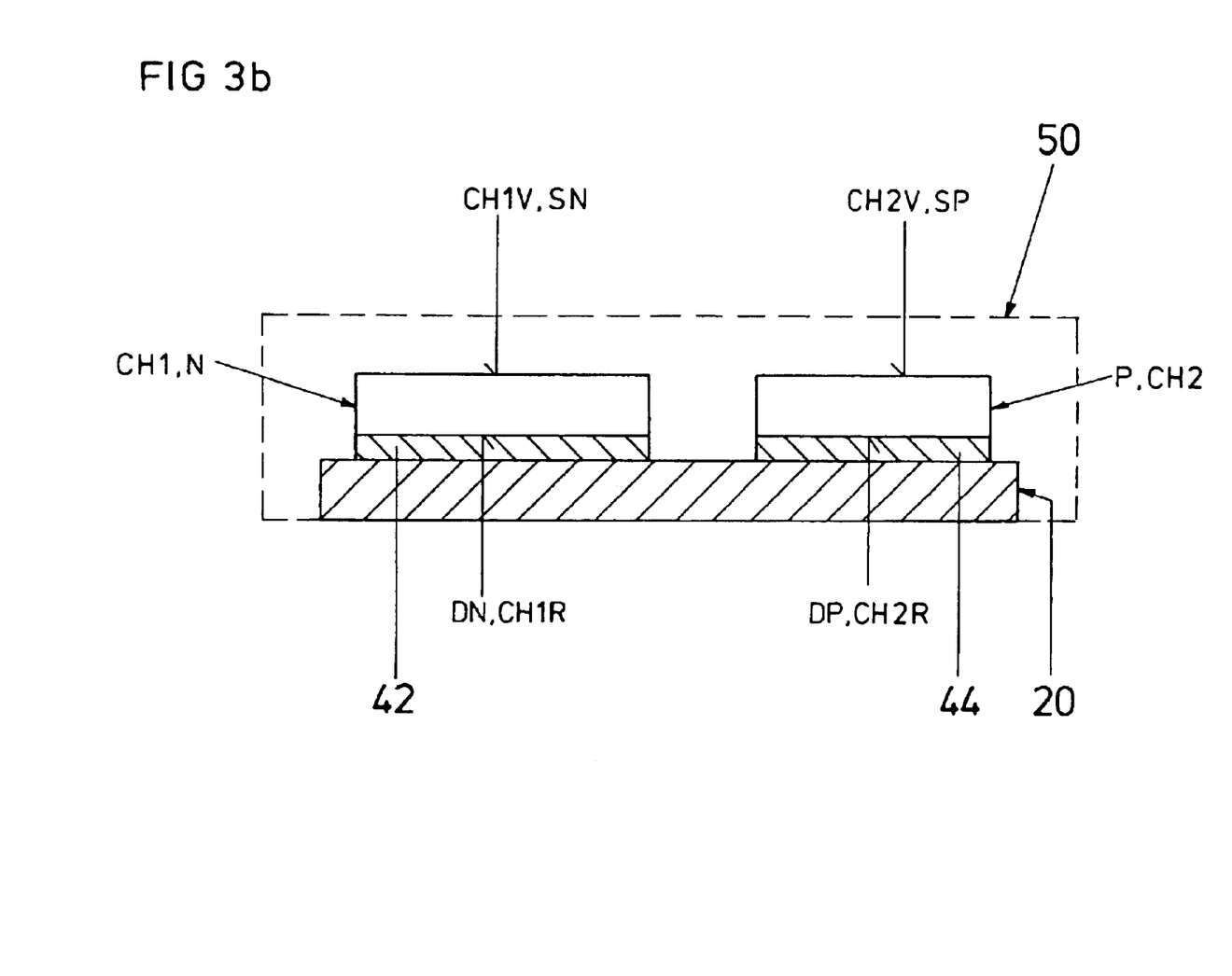

FIGS. 3a and 3b show an exemplary embodiment of the inventive half-bridge circuit, in which the two transistors P, N that are each integrated into a respective semiconductor body CH1, CH2 are arranged on a common connection plate 20. FIG. 3a shows the arrangement in plan view and FIG. 3b shows a lateral sectional illustration of the arrangement along the section line A–A' depicted in FIG. 3a.

The n-channel transistor N and the p-channel transistor P are in each case integrated in a semiconductor body or a chip CH1, CH2, which are each of essentially parallelepipedal design. In this case, a rear side CH1R of the semiconductor body CH1 of the n-channel transistor N forms the drain connection DN of the transistor N and a rear side CH2R of the semiconductor body CH2 of the p-channel transistor P forms the drain connection DP of the transistor. The two transistors N, P, or the semiconductor bodies CH1, CH2, are applied to the connection plate 20 next to one another by their rear sides CHR1, CH2R and are electrically conductively connected to the plate. Connecting layers 42, 44 between the semiconductor bodies CH1, CH2 and the connection plate 20 include, for example, an electrically conductive soldering material or an electrically conductive adhesive. In this way, the drain connections DN, DP are electrically conductively connected to one another via the connecting layers 42, 44 and via the connection plate 20.

The source connection SN and the gate connection GN of the n-channel transistor N are available at the front side CH1V of the semiconductor body CH1. Correspondingly, the source connection SP and the gate connection GP of the p-channel transistor P are available at the front side CH2V of the semiconductor body CH2. In this case, the source connections SN, SP each occupy a large part of the areas of the front sides CH1V, CH2V. In the example illustrated, the gate connections GN, GP are each situated in a corner of the essentially square front sides CH1V, CH2V and are electrically insulated from the source connections SN, SP surrounding the gate connections GN, GP by insulation layers OX1, OX2. The gate connections GN, GP can be situated at virtually any other positions at the front sides CH1V, CH2V of the semiconductor bodies CH1, CH2. Thus, the gate connections GP, GN may be arranged, in particular, at the edge of the respective front side CHV1, CHV2 as shown by the solid lines in FIG. 3a or the gate connections GP, GN can be arranged in the center between two corners, as is illustrated by the broken lines in the semiconductor body CH1 shown in FIG. 3a.

The connection plate 20 with the transistors N, P arranged thereon is preferably surrounded by a plastic layer 50, in order to protect the transistors N, P against mechanical influences. This plastic layer 50 forms a housing 50, which is illustrated by the broken lines shown in FIGS. 3a, 3b. The connection plate 20 has a connection pin 203 which projects from the housing 50 to enable external contact with the connection plate 20 and hence with the drain connections DN, DP of the two transistors P, N. Further electrically conductive connection pins 201, 202, 204, 205 which project from the housing 50 are provided on the housing 50. The connection pin 201 serves for making contact with the source connection SN of the first transistor N and is therefore connected to the source connection SN at the front side CH1V of the chip CH1 by a bonding wire B1. The connection pin 202 serves for making contact with the gate GN of the n-channel transistor N. The gate GN at the front side CH1V of the chip CH1 is therefore connected to the connection pin 202 by a bonding wire B2. In a corresponding manner, the gate GP at the front side CH2V of the chip CH2 is connected to the connection pin 204 by a bonding wire B3, and the source connection SP is connected to the connection pin 205 by a bonding wire B4. The connection pin 201 of the arrangement illustrated in FIG. 3a forms the connection terminal K2 of the circuit shown in FIG. 2. The connection pin 205 forms the connection terminal K1. The connection pin 202 forms the connection terminal for connection of the second output 105 of the drive circuit 10, which is not illustrated in greater detail in FIG. 3a. The connection pin 204 forms the connection terminal for the first output 104 of the drive circuit. The connection pin 203 of the common connection plate 20 forms the output OUT of the half-bridge circuit.

FIG. 4 shows a further exemplary embodiment of the half-bridge circuit according to the invention, in which the drive circuit 10 is integrated in a semiconductor body CH3 or a chip CH3 which is applied directly to the front side CH1V of the semiconductor body CH1. The input connection 101 for feeding in the input signal SN, the connection 102 for connecting to the terminal K1, the connection 103 for connecting to the terminal 103, and the outputs 104, 105 of the drive circuit 10 are located at a front side CH3V of the drive circuit 10.

In the exemplary embodiment illustrated, the arrangement shown in FIG. 4 is partly surrounded by a plastic layer. Five connection legs 201, 202, 203, 204, 205 project from the plastic layer. One of the connection legs 203 is part of the connection plate 20 and forms the output OUT of the half-bridge circuit.

Figure 4A:
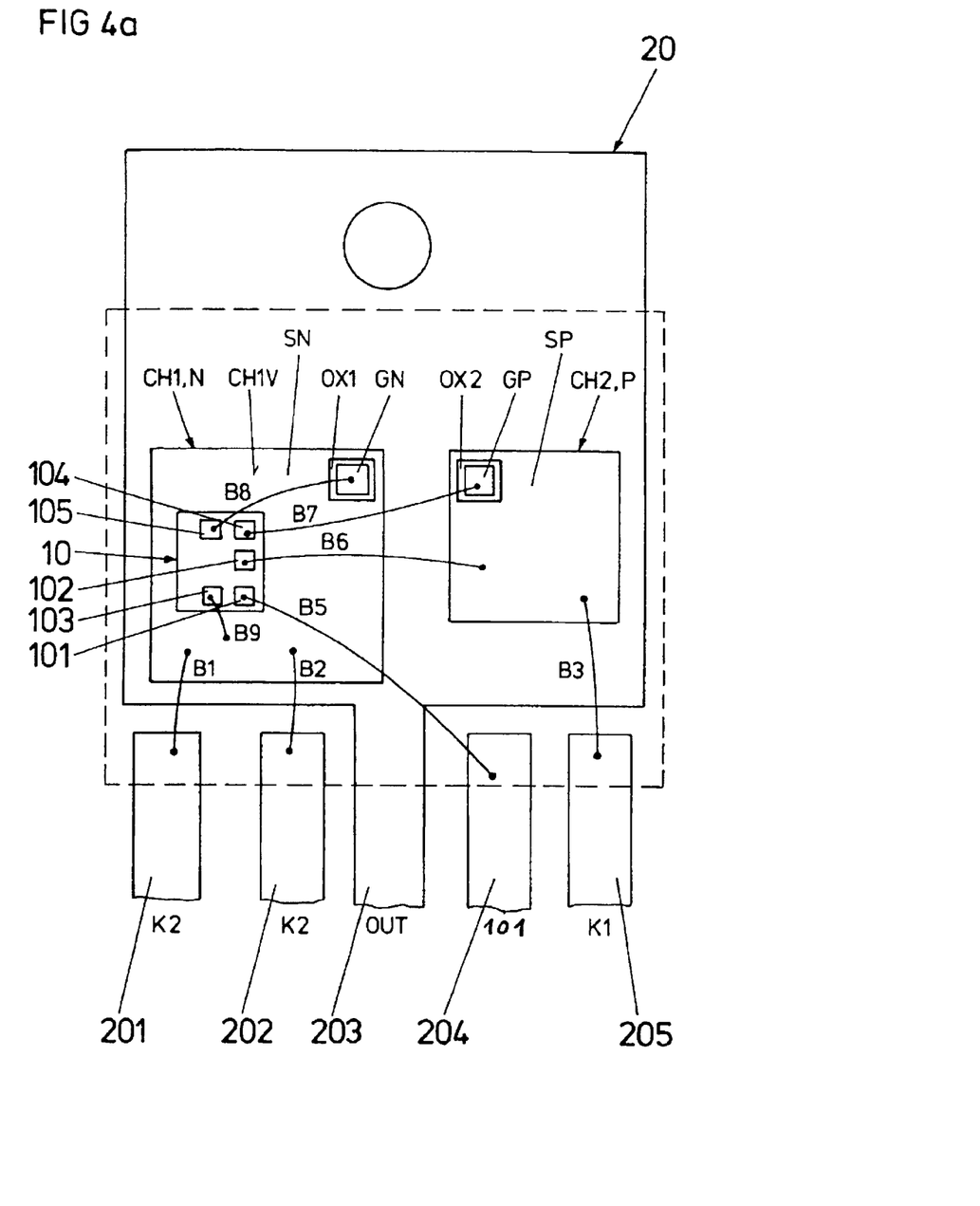
FIG. 4a is a plan view of an inventive half-bridge circuit with a drive circuit applied to the semiconductor body of the first transistor.

The allocation of the connection legs shown in FIG. 4a differs from that in FIG. 3a because the drive circuit 10 is accommodated in the housing 50 and need not be connected via the connection legs to the transistors N, P. Thus, in the exemplary embodiment shown in FIG. 4a, the connection legs 201, 202 are provided for connecting to the second terminal or actually form the second supply terminal K2. To that end, the source connection SN1 of the first transistor N is connected to the connection legs 201, 202 by two bonding wires BE1, B2. Connection by means of the two bonding wires BE1, B2 provides the advantage that the source SN of the transistor N is connected in a low-impedance manner to the terminal K2, or to the supply potential available there, usually ground. The source SP at the front side CH2V of the semiconductor body CH2 is connected to the connection leg 205 by a bonding wire B3; the connection layer forming the first terminal K1. Furthermore, the input connection 101 of the drive circuit 10 is connected to the connection leg 204 by a bonding wire B5; the connection layer forming the input connection 101 of the drive circuit for feeding in the input signal Sin.

Within the housing, the connection 102 of the drive circuit 10 is connected to the source SP of the p-channel transistor P by a bonding wire B6, and via the source SP and via the bonding wire B3, to the terminal K1. The first output 104 of the drive circuit 10 is connected to the gate GP on the chip CH2 by a bonding wire B7, and the output 105 is connected to the gate GN on the chip CH1 of the n-channel transistor N by a bonding wire B8. The connection 103 is connected by a bonding wire B9 to the source SN, and consequently, via the bonding wires B1, B2 to the connection legs 201, 202, which form the second terminal K2.

Figure 4B:
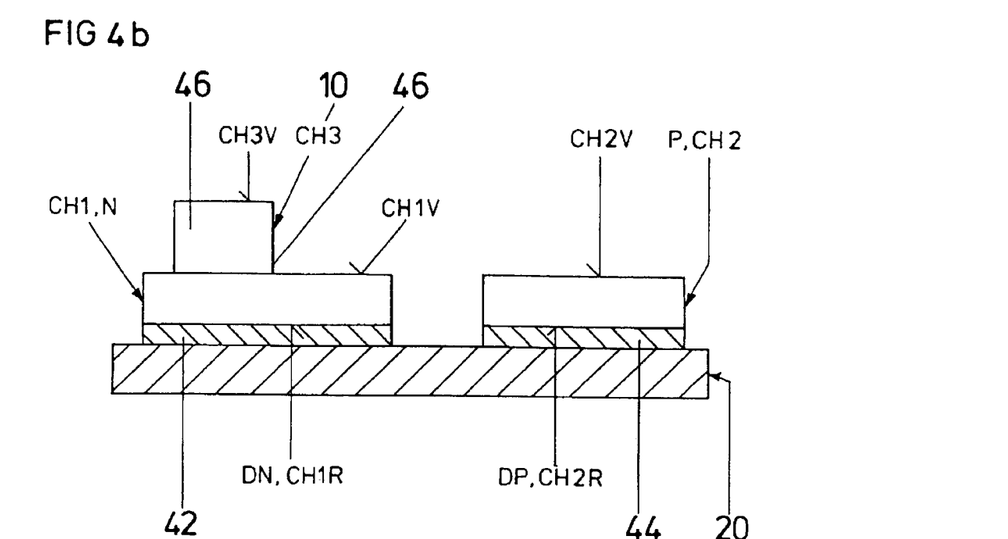

As can be gathered from FIG. 4b, in particular, the rear side CH3R of the semiconductor body CH3 is applied to the front side CH1V of the first semiconductor body CH1.

Protective layers made of an imide are usually applied to the front sides CHV1, CHV2 of the semiconductor bodies CH1, CH2. The bonding wires B1, B2, B3, B9 for producing electrical contacts penetrate these protective layers. The protective layer applied to the front side CHV1 prevents the existence of an electrical contact between the source SN at the front side CHV1 of the first semiconductor body CH1 and the rear side CH3R of the semiconductor body CH3. The task of the protective layer is to protect the semiconductor bodies CH1, CH2 from damage, in particular when the semiconductor body CH3 is placed onto the semiconductor body CH1.

Figure 4C:
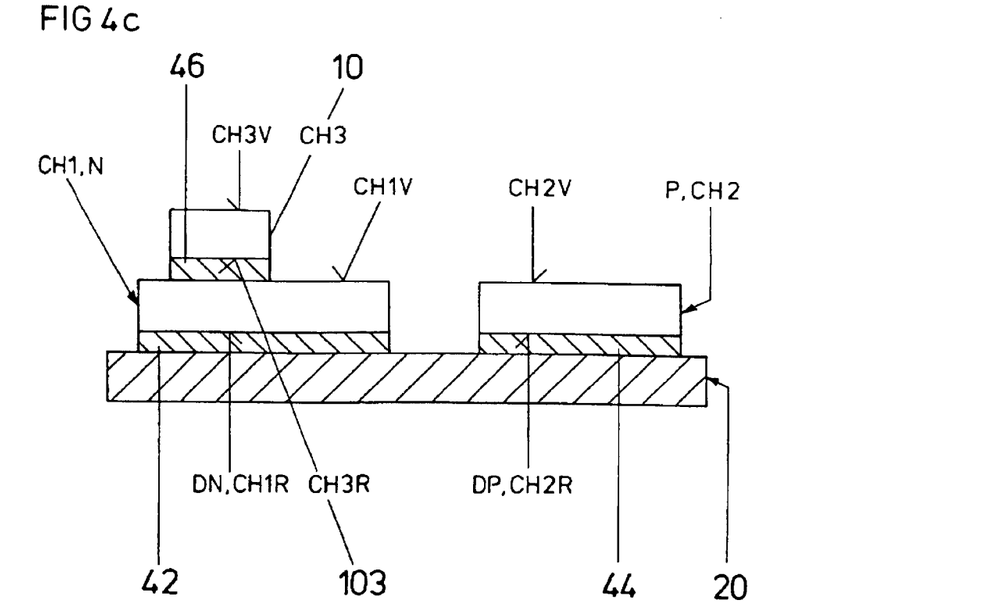

In the embodiment illustrated in FIG. 4c, such a protective layer is dispensed with at the front side CH1V of the semiconductor body CH1 and the rear side CH3R of the semiconductor body CH3 forms the connection 103 of the drive circuit 10 for connecting to the terminal K2. The rear side CH3R of the semiconductor body CH3 is applied to the source connection SN1 at the front side CH1V of the semiconductor body CH1 of the n-channel transistor N by an electrically conductive layer 46, for example, a soldering layer or an electrically conductive adhesive. The connection 103 of the drive circuit 10 and the source connection SN1 are electrically connected to one another by the electrically conductive layer 46. As a result, it is possible to dispense with a contact area for the connection 103 at the front side CH3V of the semiconductor body CH3 and the bonding wire B9.

The circuit arrangement shown in FIGS. 4a–4c represents a space-saving realization of the half-bridge circuit, which is illustrated in the circuit diagram in FIG. 2,—with the drive circuit 10 and the transistors P, N.

Figure 5:
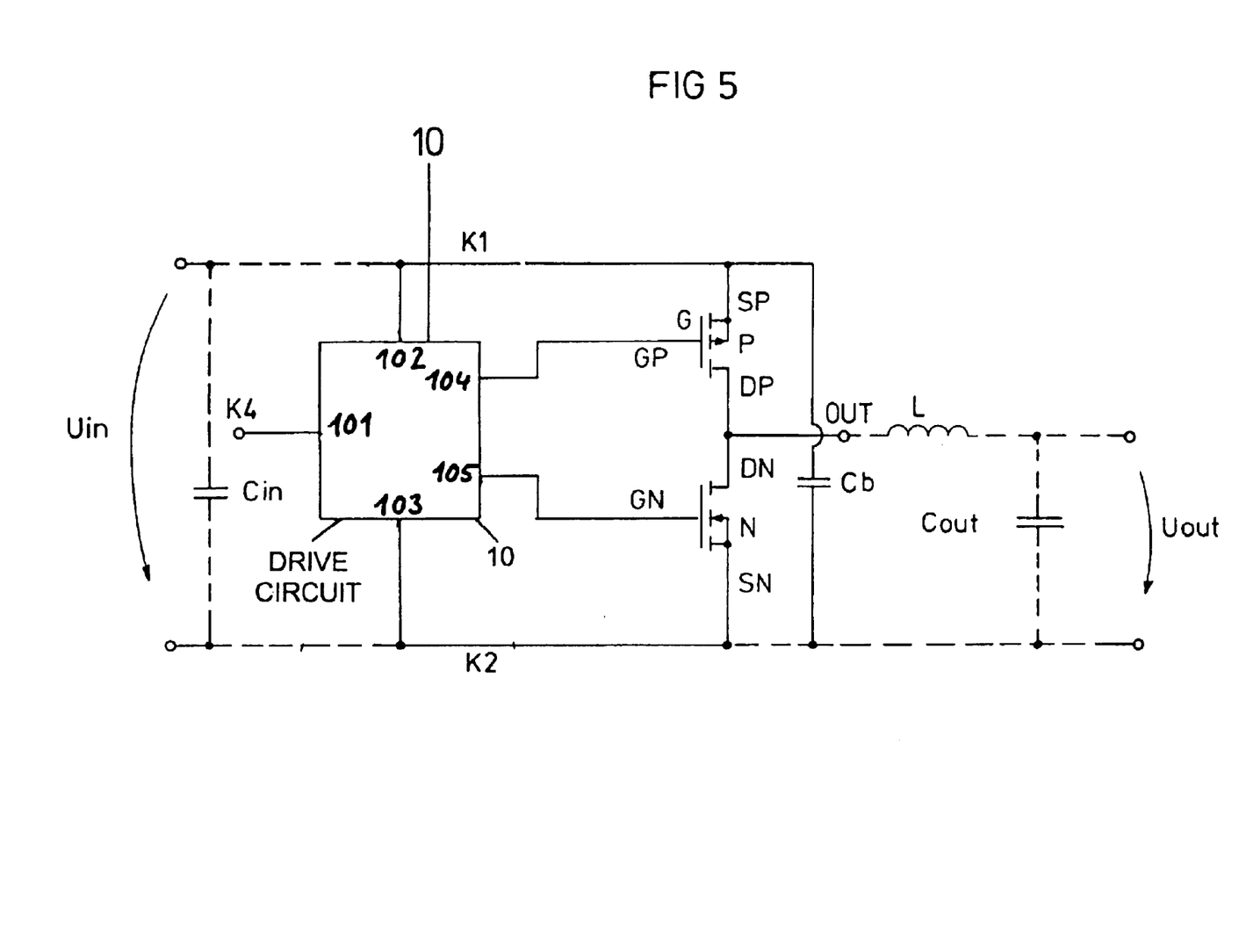
FIG. 5 shows an electrical equivalent circuit diagram of another embodiment of the half-bridge circuit.

FIG. 5 shows the circuit diagram of a further exemplary embodiment of an inventive half-bridge circuit, which differs from that illustrated in FIG. 2 by a capacitor Cb, which is connected to the connection terminals K1, K2.

Figure 6A:
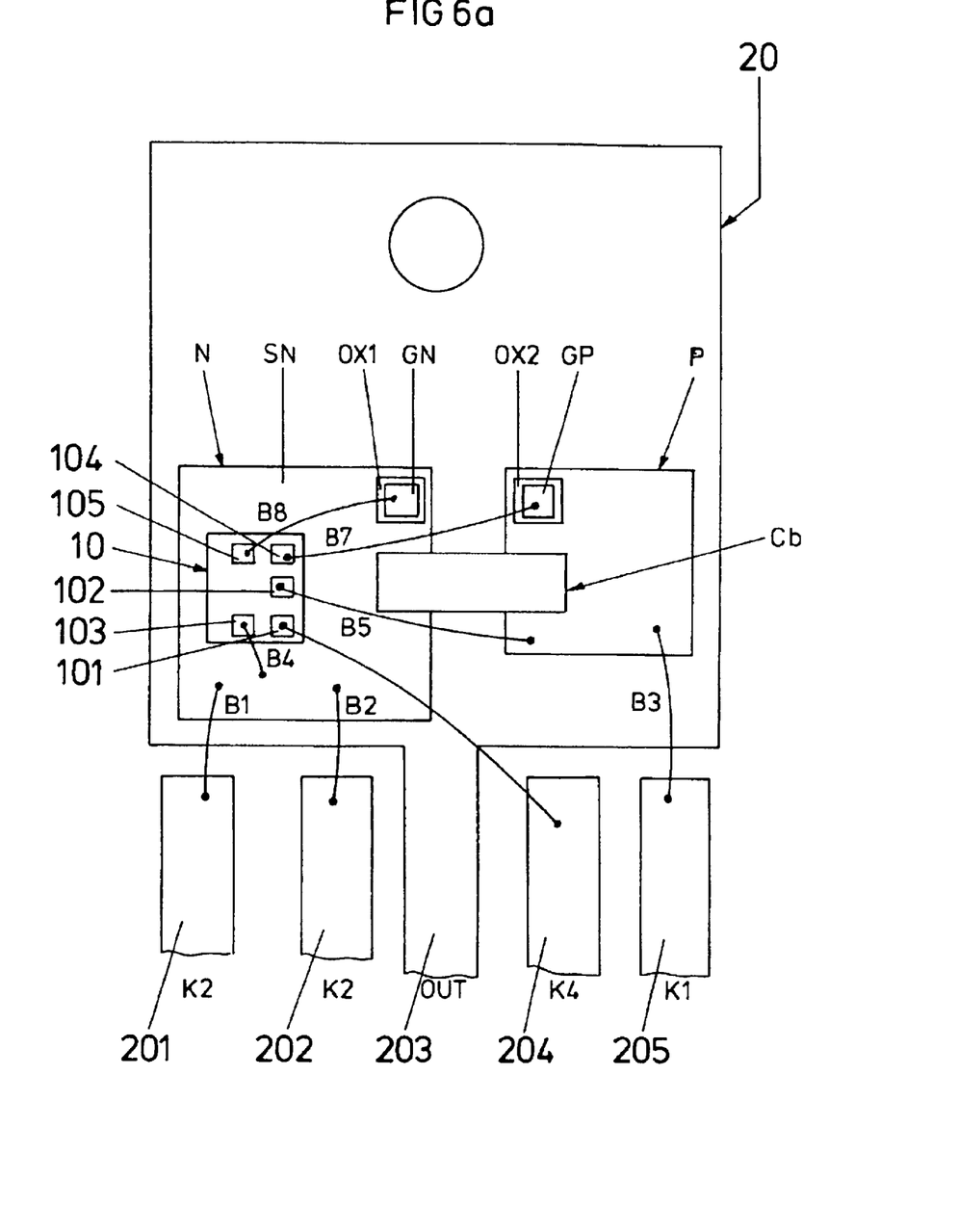
FIG. 6a shows a plan view of the half-bridge circuit shown in FIG. 5, which is applied to a common connection plate.
Figure 6B:
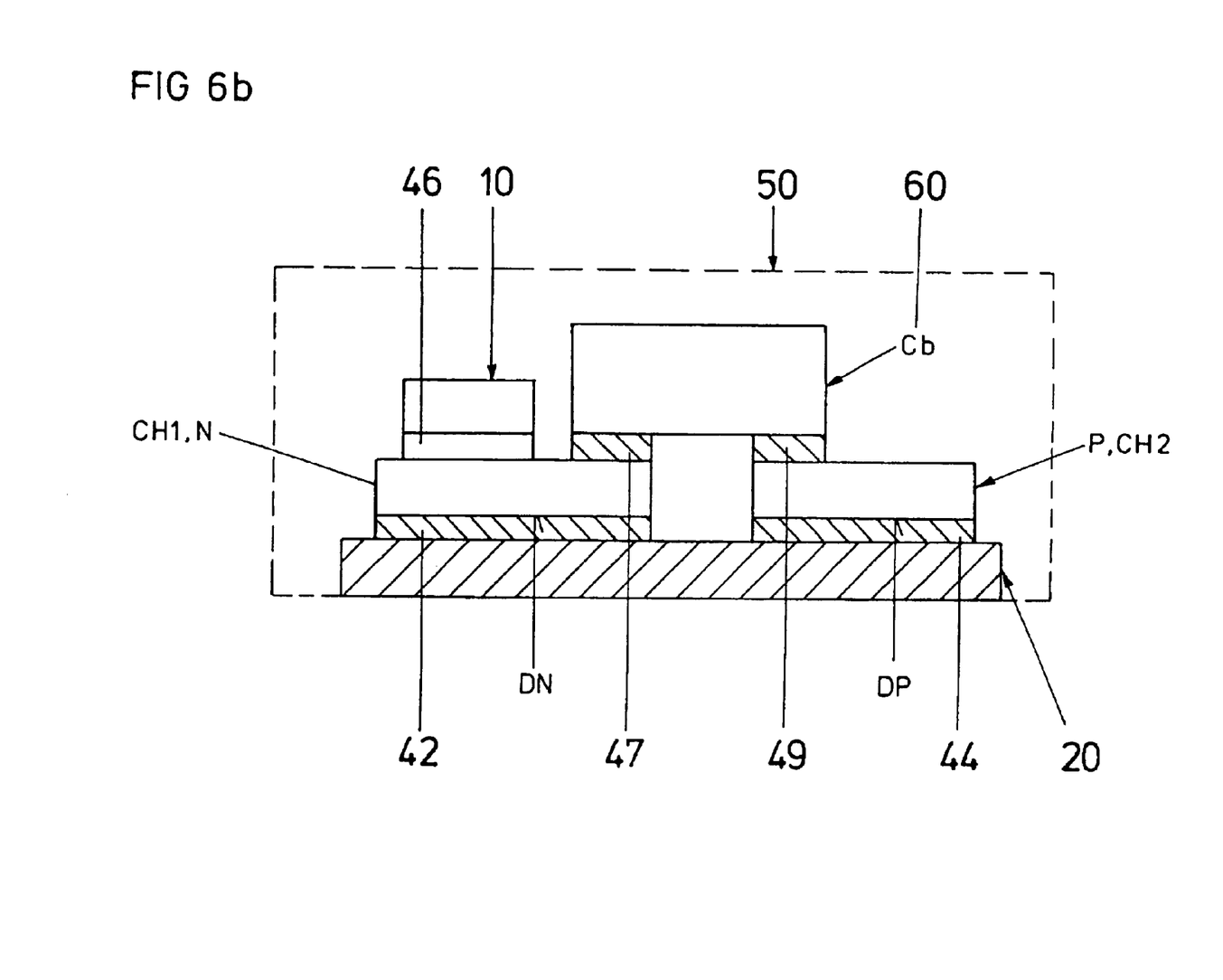

FIGS. 6a and b show a space-saving realization of the circuit arrangement shown in FIG. 5. The capacitor Cb is preferably designed as a ceramic multilayer capacitor having a parallelepipedal form. The connections of the parallelepipedal capacitor Cb are arranged at ends thereof.

In an embodiment that is not specifically illustrated, one of the connections is connected to the source region SN at the front side CH1V of the chip CH1 of the n-channel transistor N by a bonding wire, and the other connection is electrically conductively connected to the source region SP at the front side CH2V of the chip CH2 by a bonding wire. It is necessary to connect the capacitor Cb to the source connections SN, SP by bonding wires when electrically insulating protective layers that are penetrated by the bonding wires are applied to the front sides CH1V, CH2V of the semiconductor bodies.

In the exemplary embodiment illustrated in FIG. 6b, no such protective layer is applied to the front sides CH1V, CH2V of the semiconductor bodies CH1, CH2. In this embodiment, one of the connections of the capacitor Cb is applied to the source region SN at the front side CH1V of the chip CH1 of the n-channel transistor N by an electrically conductive layer 47. The other connection is connected to the source region SP at the front side CH2V of the chip CH2 of the p-channel transistor P by an electrically conductive layer 49. The electrically conductive layers 47, 49 are preferably layers made of soldering material or layers made of electrically conductive adhesive.

The arrangement in accordance with FIG. 6 is also preferably enclosed by a plastic layer 50 forming a housing for the arrangement.

We claim:

1. A half-bridge circuit, comprising:
   a first semiconductor body having a first MOS transistor that is integrated in said first semiconductor body, said first MOS transistor being a vertically designed n-conducting MOS transistor, said first semiconductor body further having a front side and a rear side, said first MOS transistor having a drive connection and a first load path connection accessible at said front side of said first semiconductor body, said first MOS transistor having a second load path connection accessible at said rear side of said first semiconductor body;
   a second semiconductor body having a second MOS transistor that is integrated in said second semiconductor body, said second MOS transistor being a vertically designed p-conducting MOS transistor, said second semiconductor body further having a front side and a rear side, said second MOS transistor having a drive connection and a first load path connection accessible at said front side of said second semiconductor body, said second MOS transistor having a second load path connection accessible at said rear side of said second semiconductor body;
   a drive circuit for driving said first MOS transistor and said second MOS transistor;
   a common connection plate to which said first MOS transistor and said second MOS transistor are applied; and
   a first connection terminal and a second connection terminal;
   said first MOS transistor and said second MOS transistor being connected in series between said first connection terminal and said second connection terminal.

2. The half-bridge circuit according to claim 1, comprising an electrically conductive adhesive that bonds said first semiconductor body and said second semiconductor body onto said common connection plate.

3. The half-bridge circuit according to claim 1, comprising an electrically conductive adhesive that solders said first semiconductor body and said second semiconductor body onto said common connection plate.

4. The half-bridge circuit according to claim 1, comprising:
   a third semiconductor body into which said drive circuit is integrated; and
   said third semiconductor body being applied to said front side of said first semiconductor body.

5. The half-bridge circuit according to claim 1, comprising: a common housing surrounding said first semiconductor body, said second semiconductor body, and said drive circuit.

6. The half-bridge circuit according to claim 1, comprising:
   a capacitor connected between said first load path connection of said first transistor and said first load path connection of said second transistor.

7. A half-bridge circuit, comprising:
   a first semiconductor body having a first MOS transistor that is integrated in said first semiconductor body, said first MOS transistor being a vertically designed n-conduction MOS transistor and having a first load path connection;
   a second semiconductor body having a second MOS transistor that is integrated in said second semiconductor body, said second MOS transistor being a vertically designed p-conducting MOS transistor and having a first load path connection;
   a drive circuit for driving said first MOS transistor and said second MOS transistor;
   a common connection plate to which said first MOS transistor and said second MOS transistor are applied;
   a first connection terminal and a second connection terminal, said first MOS transistor and said second MOS transistor being connected in series between said first connection terminal and said second connection terminal;
   a capacitor connected between said first load path connection of said first transistor and said first load path connection of said second transistor, said capacitor applied to said first semiconductor body and to said second semiconductor body, said capacitor having a first connection connected to said first semiconductor body, and said capacitor having a second connection connected to said second semiconductor body.

8. The half-bridge circuit according to claim 7, comprising:
   a bonding wire electrically connecting said first connection of said capacitor to said first semiconductor body; and
   a bonding wire electrically connecting said second connection of said capacitor to said second semiconductor body.

9. The half-bridge circuit according to claim 7, comprising:
   a first layer electrically connecting said first connection of said capacitor to said first semiconductor body; and
   a second layer electrically connecting said second connection of said capacitor to said second semiconductor body;
   said first layer and said second layer being made of a material selected from the group consisting of a soldering material and an electrically conductive adhesive.

10. A switching regulator, comprising:
    a half-bridge circuit, including:
    a first semiconductor body having a first MOS transistor that is integrated in said first semiconductor body, said first MOS transistor being a vertically designed n-conducting MOS transistor, said first semiconductor body further having a front side and a rear side, said first MOS transistor having a drive connection and a first load path connection accessible at said front side of said first semiconductor body, said first MOS transistor having a second load path connection accessible at said rear side of said first semiconductor body;

a second semiconductor body having a second MOS transistor that is integrated in said second semiconductor body, said second MOS transistor being a vertically designed p-conducting MOS transistor, said second semiconductor body further having a front side and a rear side, said second MOS transistor having a drive connection and a first load path connection accessible at said front side of said second semiconductor body, said second MOS transistor having a second load path connection accessible at said rear side of said second semiconductor body;

a drive circuit for driving said first MOS transistor and said second MOS transistor;

a common connection plate to which said first MOS transistor and said second MOS transistor are applied; and a first connection terminal and a second connection terminal;

said first MOS transistor and said second MOS transistor being connected in series between said first connection terminal and said second connection terminal.

11. A switching regulator, comprising:

a half-bridge circuit, including:

a first semiconductor body having a first MOS transistor that is integrated in said first semiconductor body, said first MOS transistor being a vertically designed n-conducting MOS transistor and having a first load path connection;

a second semiconductor body having a second MOS transistor that is integrated in said second semiconductor body, said second MOS transistor being a vertically designed p-conducting MOS transistor and having a first load path connection;

a drive circuit for driving said first MOS transistor and said second MOS transistor;

a common connection plate to which said first MOS transistor and said second MOS transistor are applied;

a first connection terminal and a second connection terminal, said first MOS transistor and said second MOS transistor being connected in series between said first connection terminal and said second connection terminal;

a capacitor connected between said first load path connection of said first transistor and said first load path connection of said second transistor, said capacitor applied to said first semiconductor body and to said second semiconductor body, said capacitor having a first connection connected to said first semiconductor body, and said capacitor having a second connection connected to said second semiconductor body.

* * * * *